US012805245B2

(12) United States Patent
Sakamoto et al.

(10) Patent No.: US 12,805,245 B2
(45) Date of Patent: Nov. 17, 2026

(54) SEMICONDUCTOR MANUFACTURING APPARATUS FOR MOLDING RESIN AND METHOD OF MANUFACTURING SEMICONDUCTOR DEVICE

(71) Applicant: Mitsubishi Electric Corporation, Tokyo (JP)

(72) Inventors: Ken Sakamoto, Tokyo (JP); Keitaro Ichikawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 337 days.

(21) Appl. No.: 18/565,355

(22) PCT Filed: Jun. 9, 2021

(86) PCT No.: PCT/JP2021/021839
§ 371 (c)(1),
(2) Date: Nov. 29, 2023

(87) PCT Pub. No.: WO2022/259395
PCT Pub. Date: Dec. 15, 2022

(65) Prior Publication Data
US 2024/0266194 A1 Aug. 8, 2024

(51) Int. Cl.
*H10P 72/00* (2026.01)
*H10W 74/01* (2026.01)

(52) U.S. Cl.
CPC ....... *H10P 72/0441* (2026.01); *H10W 74/016* (2026.01)

(58) Field of Classification Search
CPC ......................... H10P 72/0441; H10W 74/016
See application file for complete search history.

(56) References Cited

U.S. PATENT DOCUMENTS

2010/0219517 A1 9/2010 Yoshiba et al.
2011/0097430 A1* 4/2011 Choi ................ B29C 45/14655 425/110

(Continued)

FOREIGN PATENT DOCUMENTS

DE 112014007140 T5 8/2017
JP H02-246349 A 10/1990

(Continued)

OTHER PUBLICATIONS

English Translation of KR-19980018456-U (Year: 1998).*

(Continued)

*Primary Examiner* — Lex H Malsawma
(74) *Attorney, Agent, or Firm* — Studebaker Brackett PLLC

(57) ABSTRACT

An object is to provide a technology for enabling reduction in cracks in cut portions of adjacent molded parts when a runner part that connects the molded parts is cut and removed. A semiconductor manufacturing apparatus includes: a plurality of cavities filled with a molding resin to form a plurality of respective molded parts; and at least one runner through which the molding resin flows, the at least one runner having one end connected to a gate of one of the cavities, and an other end connected to a gate of an other of the cavities, the cavities being adjacent to each other, wherein an upper end of the at least one runner on one end side is higher than an upper end of the at least one runner on an other end side.

15 Claims, 10 Drawing Sheets

(56) References Cited

U.S. PATENT DOCUMENTS

| | | | | |
|---|---|---|---|---|
| 2013/0237014 | A1 | 9/2013 | Sakakibara et al. | |
| 2017/0294369 | A1 | 10/2017 | Kawashima et al. | |
| 2022/0293434 | A1 * | 9/2022 | Iwai | H10W 74/016 |

FOREIGN PATENT DOCUMENTS

| | | | | | |
|---|---|---|---|---|---|
| JP | H06-275671 | A | | 9/1994 | |
| JP | H08-250530 | A | | 9/1996 | |
| JP | H09-019939 | A | | 1/1997 | |
| JP | 2010-109314 | A | | 5/2010 | |
| JP | 2013-187441 | A | | 9/2013 | |
| KR | 19980018456 | U | * | 7/1998 | H10P 72/0438 |
| WO | 2016/072012 | A1 | | 5/2016 | |

OTHER PUBLICATIONS

Office Action issued in DE 11 2021 007 793.7; mailed by the German Patent and Trademark Office on Dec. 19, 2025.

International Search Report issued in PCT/JP2021/021839; mailed Aug. 24, 2021.

An Office Action; "Notice of Reasons for Refusal," mailed by the Japanese Patent Office on Jun. 11, 2024, which corresponds to Japanese Patent Application No. 2023-526705 and is related to U.S. Appl. No. 18/565,355; with English language translation.

An Office Action; mailed by the China National Intellectual Property Administration of the People's Republic of China on Aug. 27, 2026, which corresponds to Chinese Patent Application No. 202180098986.9 and is related to U.S. Appl. No. 18/565,355.

* cited by examiner

SEMICONDUCTOR MANUFACTURING APPARATUS FOR MOLDING RESIN AND METHOD OF MANUFACTURING SEMICONDUCTOR DEVICE

TECHNICAL FIELD

The present disclosure relates to a semiconductor manufacturing apparatus and a method of manufacturing a semiconductor device.

BACKGROUND ART

Semiconductor elements of one type whose current path is set in a vertical direction of the elements to support high voltages and large currents are generally referred to as power semiconductor elements. Examples of the power semiconductor elements include an insulated-gate bipolar transistor (IGBT) element, a metal-oxide-semiconductor field-effect transistor (MOSFET) element, a bipolar transistor element, and a diode element.

Semiconductor devices on which the power semiconductor elements are mounted include mold-encapsulated semiconductor devices. A mold-encapsulated semiconductor device is assembled by first mounting a semiconductor element on a lead frame, next bonding the semiconductor element to the lead frame by wire bonding, and encapsulating these with a molding resin such as an epoxy resin. A general encapsulating method with a molding resin is transfer molding of clamping the lead frame with a top mold and a bottom mold and injecting the molding resin into cavities.

A molding resin injection process using multiple columns is generally known as a method of molding the mold-encapsulated semiconductor devices with high productivity. In this resin injection process, adjacent cavities are connected through a runner. Injecting a molding resin into the cavities through the runner and further injecting the molding resin into adjacent cavities through a runner next to the runner are repeated (see, for example, Patent Document 1).

PRIOR ART DOCUMENT

Patent Document

Patent Document 1: Japanese Unexamined Patent Application Publication No. H8-250530

SUMMARY

Problem to be Solved by the Invention

Molds used in conventional resin injection processes each include a runner between adjacent cavities. Thus, not only molded parts corresponding to the cavities but also runner parts corresponding to the runners are also formed. Since the runner parts are unnecessary, the runner parts are cut and removed by a punch in a resin cutting step.

However, shear stress is applied to both longitudinal ends of the runner parts that connect adjacent molded parts when the runner parts are cut. Thus, the shear stress half the resin cutting capacity has been applied to each of the longitudinal ends of the runner parts. When the runner parts are cut and removed, cracks sometimes appear in cut portions of the molded parts.

Thus, the present disclosure has an object of providing a technology for enabling reduction in cracks in cut portions of molded parts when runner parts that connect adjacent molded parts are cut and removed.

Means to Solve the Problem

A semiconductor manufacturing apparatus according to the present disclosure includes: a plurality of cavities filled with a molding resin to form a plurality of respective molded parts; and at least one runner through which the molding resin flows, the at least one runner having one end connected to a gate of one of the cavities, and an other end connected to a gate of an other of the cavities, the cavities being adjacent to each other, wherein an upper end of the at least one runner on one end side is higher than an upper end of the at least one runner on an other end side.

Effects of the Invention

When a runner part is cut, shear stress is first applied to one end side of the runner part. Then, the shear stress is applied to the other end side of the runner part according to the present disclosure. Thus, the shear stress necessary to cut the runner part can be applied to the runner part. When the runner part that connects adjacent molded parts is cut and removed, this method can reduce cracks in cut portions of the molded parts.

The object, features, aspects, and advantages of this disclosure will become more apparent from the following detailed description and the accompanying drawings.

DESCRIPTION OF EMBODIMENTS

Embodiment 1

Figure 1:
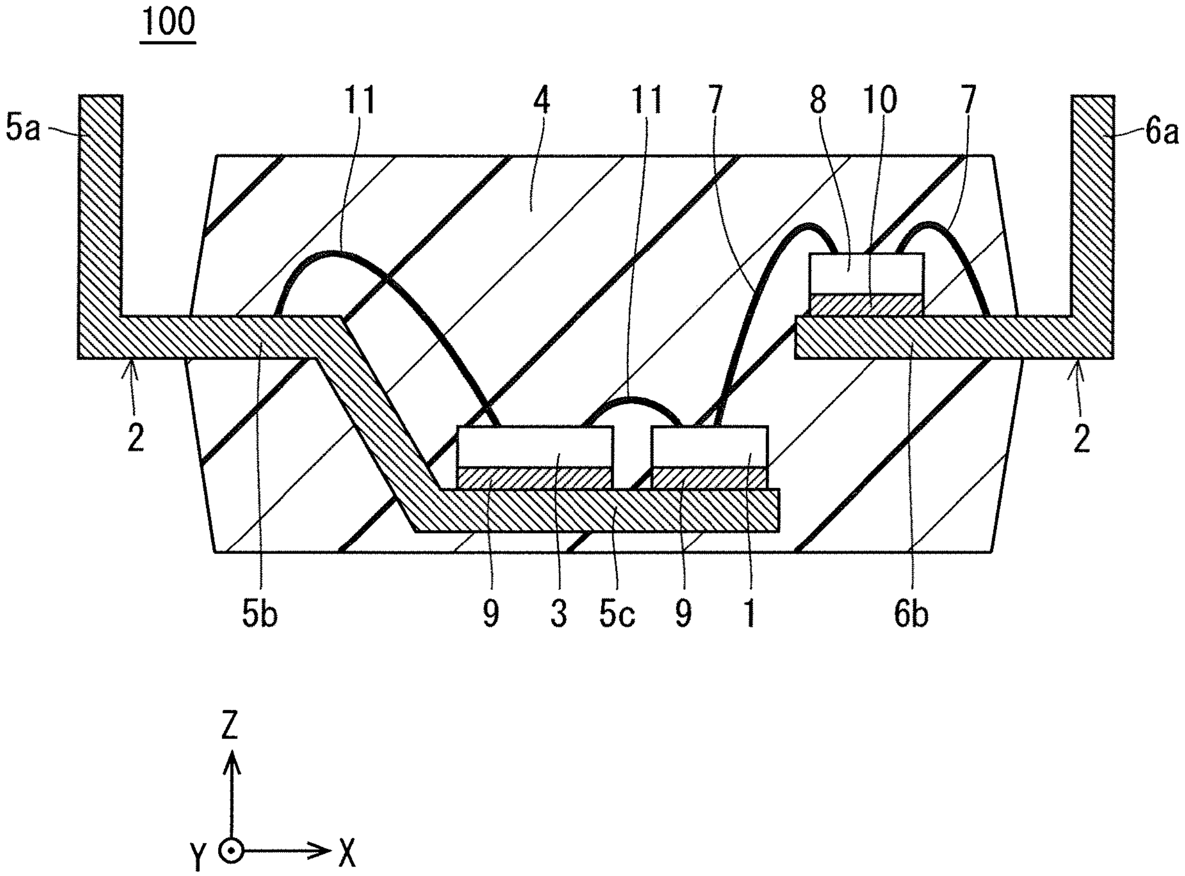
FIG. 1 is a cross-sectional view of a semiconductor device manufactured by a semiconductor manufacturing apparatus according to Embodiment 1.
Figure 2:
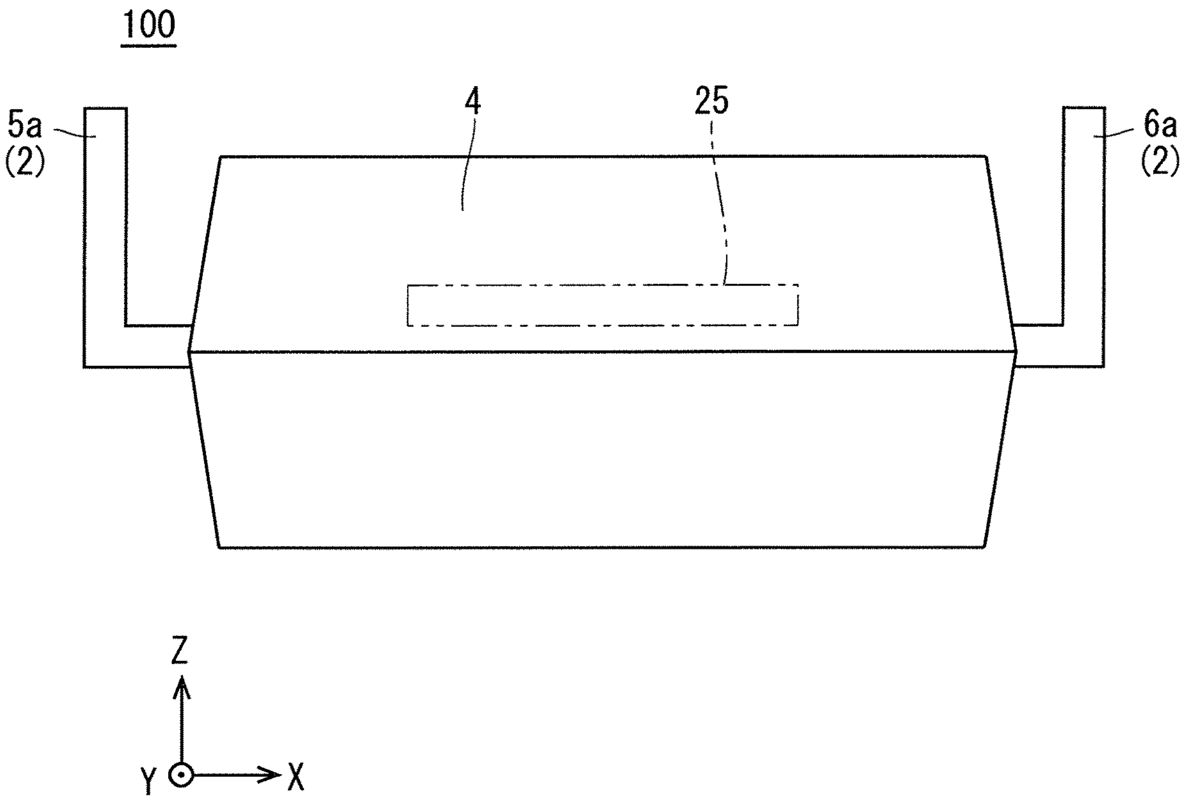
FIG. 2 illustrates a front view of the semiconductor device.

Embodiment 1 will be described with reference to the drawings. FIG. 1 is a cross-sectional view of a semiconductor device 100 manufactured by a semiconductor manufacturing apparatus according to Embodiment 1. FIG. 2 illustrates a front view of the semiconductor device 100.

In FIG. 1, the x direction, the y direction, and the z direction are orthogonal to one another. In the following drawings, the x direction, the y direction, and the z direction are also orthogonal to one another. In the following description, a direction including the x direction and a −x direction that is a direction opposite to the x direction may be referred to as an "x-axis direction". In the following description, a direction including the y direction and a −y direction that is a direction opposite to the y direction may be referred to as a "y-axis direction". In the following description, a direction including the z direction and a −z direction that is a direction opposite to the z direction will be referred to as a "z-axis direction".

First, the semiconductor device 100 manufactured by the semiconductor manufacturing apparatus will be described. As illustrated in FIG. 1, the semiconductor device 100 includes a plurality of lead frames 2, an IGBT element 1, a diode element 3, an integrated circuit (IC) element 8, and a molded part 4. The semiconductor device 100 is a semiconductor device including a power terminal 5*a* and an IC terminal 6*a* whose tips face upward (the z direction) and which are included in the plurality of lead frames 2 protruding outside from the molded part 4.

Each of the lead frames 2 are generally made of copper or a copper alloy. Since each of the lead frames 2 are stably manufactured by press working, the lead frame 2 has a width ranging from 0.1 mm to 1 mm in accordance with a value of a current flowing through the lead frame 2.

The lead frame 2 to the left (in the −x direction) in FIG. 1 includes the power terminal 5*a*, a power inner lead 5*b*, and a die pad 5*c*. The IGBT element 1 and the diode element 3 are bonded to the upper surface of the die pad 5*c* (a surface in the z direction) via solder 9. The lead frame 2 to the right (in the x direction) in FIG. 1 includes the IC terminal 6*a* and an IC inner lead 6*b*. An IC element 8 is bonded to the upper surface of the IC inner lead 6*b* (a surface in the z direction) via an Ag paste 10.

The diode element 3 and the power inner lead 5*b*, and the diode element 3 and the IGBT element 1 are wire bonded via respective power wires 11. Furthermore, the IC element 8 and the IC inner lead 6*b*, and the IC element 8 and the IGBT element 1 are wire bonded via respective IC wires 7.

Semiconductor elements to be mounted on the die pad 5*c* are not limited to the IGBT element 1 and the diode element 3 made of general Si, but may be a MOSFET element or an Schottky barrier diode (SBD) element made of SiC.

A metal with high electrical conductivity such as gold, silver, or copper is selected as a material of the IC wires 7. The metal selected as the material of the IC wires 7 is processed into thin wires less than or equal to 0.05 mm in diameter which are used as the IC wires 7.

Since the power wires 11 are connected to the elements through which a large current flows such as the IGBT element 1, inexpensive Al whose electrical conductivity is not as high as that of Ag is generally selected as a material of the power wires 11. Furthermore, the power wires 11 are processed into wires whose diameter ranges from 0.1 mm to 0.5 mm, and used.

The molded part 4 forms a package of the semiconductor device 100. As illustrated in FIG. 2, the molded part 4 is formed by transfer molding a thermosetting epoxy resin as a molding resin injected into cavities 23*a* and 23*b* (see FIG. 4) of a mold 20 (see FIG. 4) through a gate 25. A thermosetting epoxy resin containing fillers made of, for example, silicon dioxide ($SiO_2$) is generally used to approximate a thermal expansion coefficient of the molded part 4 to a thermal expansion coefficient of copper.

An insulating and heat dissipation material under the die pad 5*c* (−z direction) may be not the molded part 4 but a sheet, a direct bonded copper (DBC) substrate, an active metal brazing (AMB) substrate, or a direct bonded aluminum (DBA) substrate with a thickness ranging from 0.1 mm to 0.3 mm to further increase the heat dissipation properties while maintaining the insulating properties of the die pad 5*c*.

Here, the sheet is made of an epoxy resin containing aluminum nitride (AlN), boron nitride (BN), or silicon dioxide ($SiO_2$) as high heat dissipation fillers. The DBC substrate, the AMB substrate, or the DBA substrate is formed by combination of insulating and high-heat dissipation materials such as aluminum nitride, silicon nitride ($Si_3N_4$), or silicon dioxide.

Figure 3:
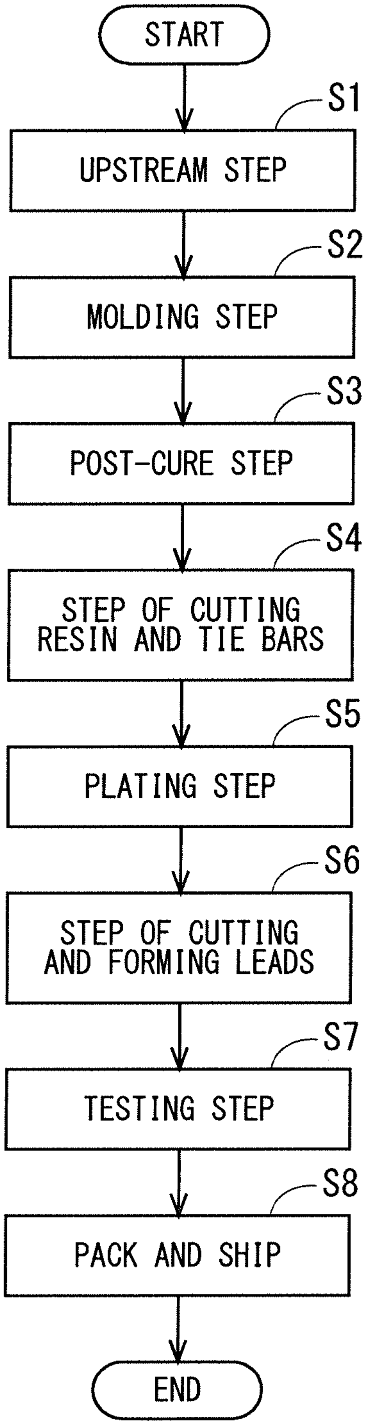
FIG. 3 is a flowchart illustrating a method of manufacturing the semiconductor device using the semiconductor manufacturing apparatus according to Embodiment 1.

Next, a method of manufacturing the semiconductor device 100 will be described. After describing the whole procedure, characteristic portions of the present disclosure will be described. FIG. 3 is a flowchart illustrating a method of manufacturing the semiconductor device 100 using the semiconductor manufacturing apparatus according to Embodiment 1.

As illustrated in FIG. 3, first, an upstream step is performed (Step S1). In Step S1, the IC element 8 is disposed on one of the lead frames 2 via the Ag paste 10, and the Ag paste 10 is cured in an oven. The IGBT element 1 and the diode element 3 are bonded to the other lead frame 2 via the solder 9.

The diode element 3 and the power inner lead 5*b*, and the diode element 3 and the IGBT element 1 are wire bonded via the respective power wires 11. The IC element 8 and the IC inner lead 6*b*, and the IC element 8 and the IGBT element 1 are wire bonded via the respective IC wires 7. Thereby, an assembly (illustration omitted) is completed.

Next, a molding step is performed (Step S2). Since details of the molding step will be described later, the step will be simply described herein without any drawings. In Step S2, molding-resin tablets are disposed in a bottom mold, and the assembly is disposed on the molding-resin tablets. After clamping a top mold to the bottom mold, a liquid molding resin is injected into cavities of the mold. Application of a high hydrostatic pressure ranging from 5 MPa to 15 MPa to the cavities of the mold with the liquid molding resin being filled forms the molded parts 4.

Next, ejector pins and plunger chips of the upper mold and the bottom mold protrude simultaneously when the upper mold and the bottom mold are opened. Thereby, the molded parts 4 are released from the upper mold and the bottom mold. The molded parts 4 each including the plurality of lead frames 2, that is, molded products (illustration omitted) are taken out of the bottom mold.

Next, a post-cure step is performed on the molded products (Step S3). In Step S3, a heater power of the oven is turned on to completely cure portions of the molded parts 4 which cannot be completely cured in the mold. The molded products are baked in the oven.

The heater power of the oven is turned off, and the molded products are cooled to the atmospheric temperature to increase a modulus of elasticity of the molded parts 4. Next, a step of cutting a resin and tie bars is performed on the molded products (Step S4). In Step S4, redundant portions of the molded parts 4 are stamped with a resin cutting die to remove the redundant portions from the molded parts 4. Furthermore, tie bars formed in the plurality of lead frames 2 are stamped with a tie-bar cutting die to remove the tie bars.

Next, a plating step is performed on the molded products (Step S5). In Step S5, a tin plating step or a tinned copper plating step is performed on the surfaces of the plurality of lead frames 2 to prevent deterioration of the surfaces of the plurality of lead frames 2 so that the plurality of lead frames 2 can be stored for a long period under a high temperature and high humidity environment. Alternatively, for example, 1,2,3-benzotriazole (BTA) that is an antioxidant film may be electro-deposited on the surfaces of the plurality of lead frames 2 as a replacement for the plating step.

Next, a step of cutting and forming leads is performed on the molded products (Step S6). In Step S6, a framework is stamped with a lead cutting die to remove the redundant framework from the plurality of lead frames 2. Then, bending the power terminal 5*a* and the IC terminal 6*a* upward (in the z direction) with a lead forming die completes the semiconductor device 100.

After test on electrical characteristics and visual inspection is performed on the semiconductor devices 100 (Step S7), the semiconductor devices 100 are packed and shipped (Step S8).

Figure 4:
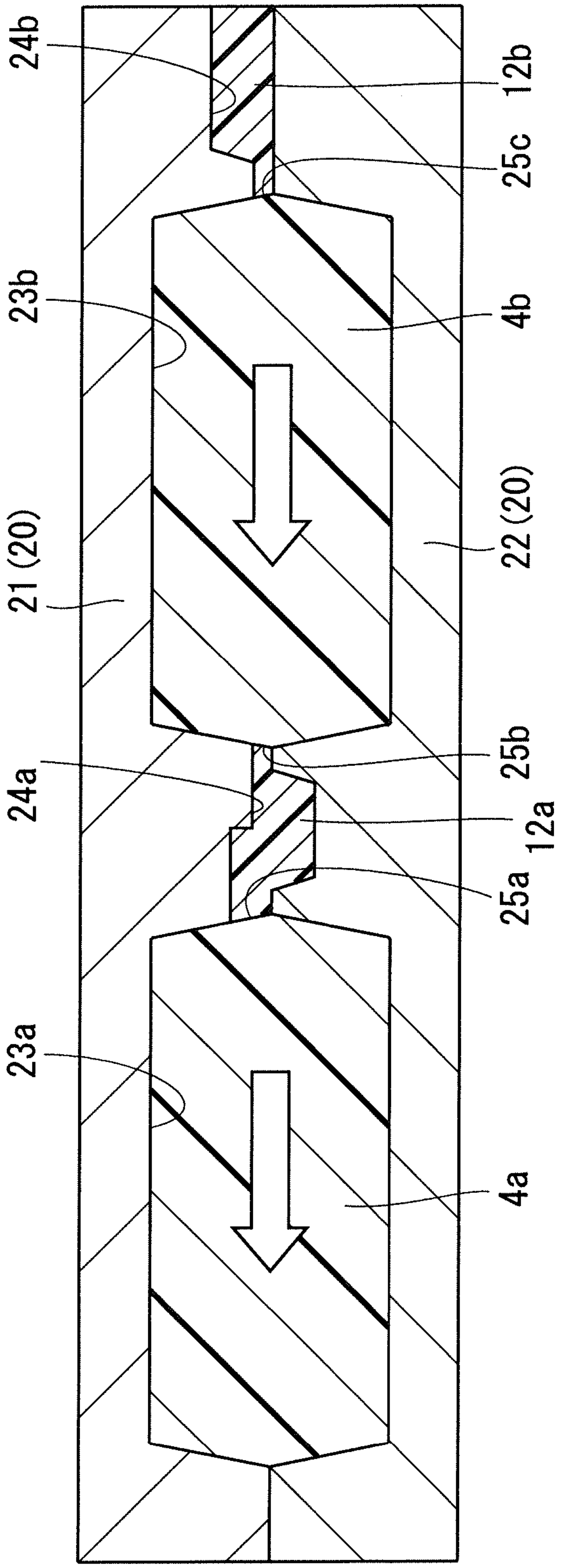
FIG. 4 is a cross-sectional view of a mold included in the semiconductor manufacturing apparatus according to Embodiment 1.
Figure 5A:
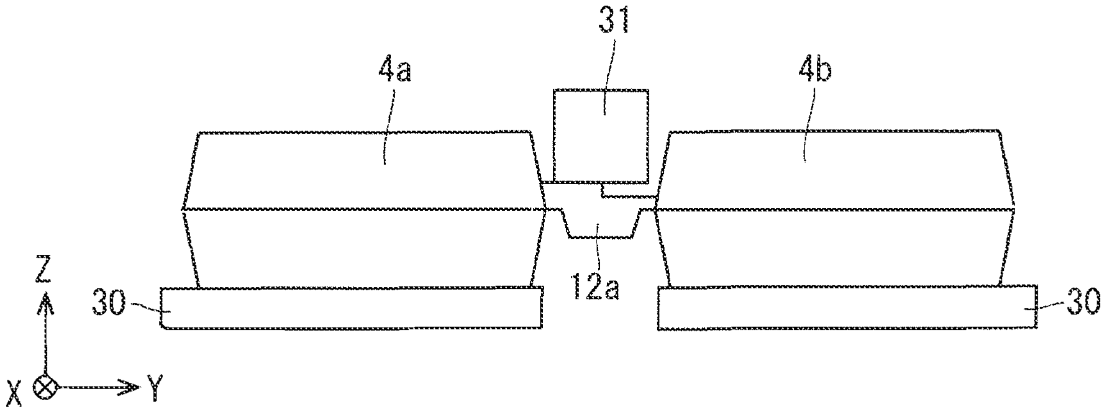
FIGS. 5A to 5C illustrates side views of the resin cutting step according to Embodiment 1.
Figure 5B:
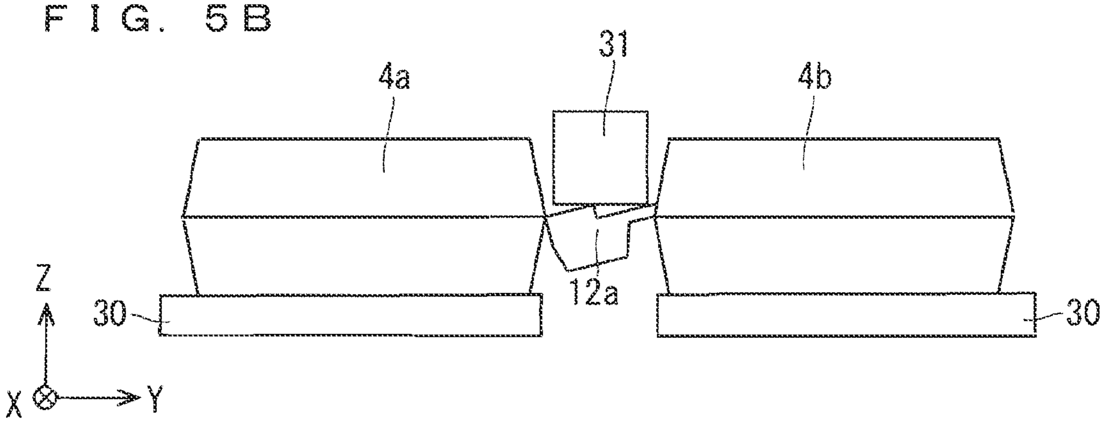
Figure 5C:
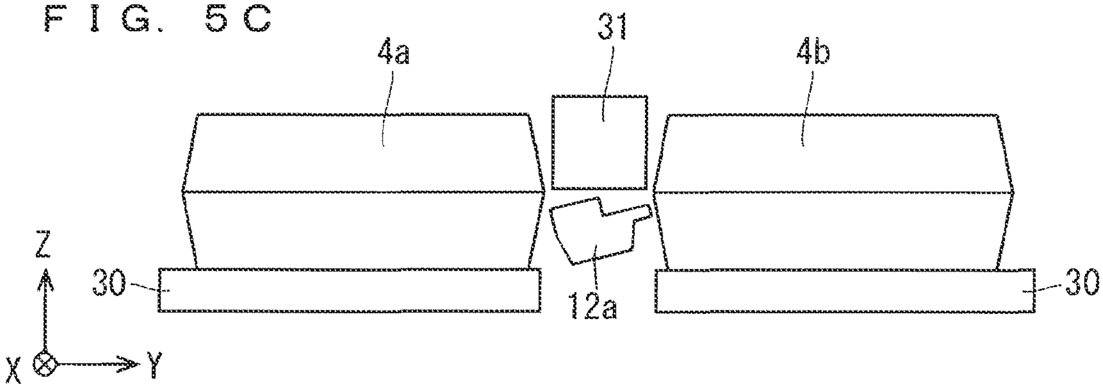

Next, the mold 20 that is a characteristic portion of the present disclosure will be described. FIG. 4 is a cross-sectional view of the mold 20 included in the semiconductor manufacturing apparatus according to Embodiment 1. FIGS. 5A to 5C are side views illustrating the resin cutting step according to Embodiment 1. The arrows in FIG. 4 illustrate a flow direction of a liquid molding resin.

As illustrated in FIG. 4, the mold 20 included in the semiconductor manufacturing apparatus includes a top mold 21 and a bottom mold 22. The mold 20 includes ejector pins and plunger chips, which are not illustrated.

The mold 20 is a multiple-column mold that simultaneously forms a plurality of the semiconductor devices 100 through transfer molding. The bottom mold 22 is disposed at a position facing the upper mold 21. Two cavities 23*a* and 23*b*, runners 24*a* and 24*b*, and gates 25*a*, 25*b*, and 25*c* are formed inside the mold 20 including the upper mold 21 and the bottom mold 22.

The runner 24*b* connects a liquid molding-resin supply source (illustration omitted) to the cavity 23*b*, and the runner 24*a* connects the adjacent two cavities 23*a* and 23*b*.

Specifically, one end of the runner 24*b* is connected to a gate 25*c* of the cavity 23*b*, and the other end thereof is connected to the liquid molding-resin supply source (illustration omitted). Furthermore, one end of the runner 24*a* is connected to a gate 25*a* of the cavity 23*a* that is one of the adjacent two cavities 23*a* and 23*b*, and the other end thereof is connected to a gate 25*b* of the cavity 23*b* that is the other of the adjacent two cavities 23*a* and 23*b*.

The gate 25*c* is an inlet of the cavity 23*b* that the molding resin enters, whereas the gate 25*b* is an outlet of the cavity 23*b* through which the molding resin exits. Furthermore, the gate 25*a* is an inlet of the cavity 23*a* that the molding resin enters.

The molding resin supplied from the molding-resin supply source through the runner 24*b* is injected into the cavity 23*b* through the gate 25*c*. Furthermore, the molding resin injected into the cavity 23*b* exits from the gate 25*b*, and is injected into the cavity 23*a* through the runner 24*a* and the gate 25*a*. Then, the molding resin continues to be injected until the molding resin fills the cavities 23*a* and 23*b*.

Although FIG. 4 illustrates an example of the formed two cavities 23*a* and 23*b*, three or more cavities may be formed without being limited by this example. The number of the runners 24*a* is changed according to the number of cavities.

In the molding step, not only two molded parts 4*a* and 4*b* are formed by filling the cavities 23*a* and 23*b*, respectively, with the molding resin, but also runner parts 12*a* and 12*b* are formed by filling the runners 24*a* and 24*b*, respectively, with the molding resin.

Since the runner parts 12*a* and 12*b* are unnecessary, the runner parts 12*a* and 12*b* are cut and removed in a resin cutting step by a punch 31 (see FIGS. 5A to 5C) included in the resin cutting die (illustration omitted). In a normal resin cutting step, burrs and flash (illustration omitted) that are produced between the molded part 4 and the tie bars (illustration omitted) and that cannot be clamped by the upper mold 21 and the bottom mold 22, and thick burrs (illustration omitted) produced as thick as the lead frames 2 without being clamped by the upper mold 21 and the bottom mold 22 are dropped and removed.

However, shear stress is applied to both ends of the runner part 12*a* that connect the two molded parts 4*a* and 4*b* when the runner part 12*a* is cut. Thus, the shear stress half the resin cutting capacity has been applied to each of the ends of the runner part 12*a*. Furthermore, both end portions of the runner part 12*a* are wider and thicker than the aforementioned burrs. Thus, when the runner part 12*a* is cut and removed, cracks sometimes appear in cut portions of the molded parts 4. Since only one end of the runner part 12*b* is connected to the molded part 4*b* and the other end thereof is not connected to anything, the runner part 12*b* does not have such a problem.

For solving the problem, an upper end (an end in the z direction) of the runner 24*a* on one end side is formed higher than an upper end (an end in the z direction) of the runner 24*a* on an other end side as illustrated in FIG. 4 to apply loads of the punch 31 to one end side and an other end side of the runner part 12*a* in order in Embodiment 1.

Specifically, a vertical width of the runner 24*a* on the one end side is greater than a vertical width of the runner 24*a* on the other end side by 0.01 mm or more. This makes the one end side of the runner part 12*a* thicker than the other end side by 0.01 mm or more, and makes an upper end (end in the z direction) of the runner 12*a* on the one end side higher than an upper end (end in the z direction) of the runner 12*a* on the other end side by 0.01 mm or more as illustrated in FIG. 5A.

Thus, when the punch 31 first moves downward (moves in the −z direction) in the resin cutting step as illustrated in FIG. 5A, the punch 31 comes in contact with the one end side of the runner part 12*a*. The load of the punch 31 is applied to the one end side in this state. This applies the shear stress of the entire resin cutting capacity to a connection between the one end of the runner part 12*a* and the molded part 4*a*. Thus, the connection between the one end of the runner part 12*a* and the molded part 4*a* is normally cut, so that the one end side of the runner part 12*a* tilts lower (in the −z direction) than the other end side as illustrated in FIG. 5B. Here, the molded parts 4*a* and 4*b* are disposed on respective upper surfaces of plate-shaped dies 30 (surfaces in the z direction) to support the molded parts 4*a* and 4*b* from below (the −z direction) when the runner part 12*a* is cut.

Next, the punch 31 comes in contact with the other end side of the runner part 12*a*. The load of the punch 31 is applied to the other end side in this state, as illustrated FIG. 5B. This applies the shear stress of the entire the resin cutting capacity to a connection between the other end of the runner part 12*a* and the molded part 4*b* as illustrated in FIG. 5C. Thus, the connection between the other end of the runner part 12*a* and the molded part 4*b* is normally cut, so that the runner part 12*a* is dropped and removed.

In summary, the semiconductor manufacturing apparatus according to Embodiment 1 includes: the plurality of cavities 23*a* and 23*b* filled with the molding resin to form a plurality of respective molded parts; and the at least one runner 24*a* through which the molding resin flows, the at least one runner 24*a* having one end connected to the gate 25*a* of the cavity 23*a* of the cavities 23*a* and 23*b*, and an other end connected to the gate 25*b* of the other cavity 23*b* of the cavities 23*a* and 23*b*, the cavities 23*a* and 23*b* being adjacent to each other, wherein an upper end (end in the z direction) of the at least one runner 24*a* on one end side is higher than an upper end (end in the z direction) of the at least one runner 24*a* on an other end side.

Specifically, a vertical width of the at least one runner 24*a* on the one end side differs from that on the other end side.

Thus, when the runner part 12*a* is cut, the shear stress is first applied to the one end side of the runner part 12*a*, and then applied to the other end side of the runner part 12*a*. Thus, the shear stress necessary to cut the runner part 12*a* can be applied to the runner part 12*a*. This can reduce cracks in cut portions of the molded parts 4*a* and 4*b* when the runner part 12*a* that connects the adjacent molded parts 4*a* and 4*b* is cut and removed. Consequently, yields of the semiconductor device 100 can be increased.

The semiconductor manufacturing apparatus further includes the dies 30 supporting the plurality of molded parts 4*a* and 4*b* from below (the −z direction) when the at least one runner part 12*a* connecting the molded parts 4*a* and 4*b* is cut, the molded parts 4*a* and 4*b* being adjacent to each other.

Since the plurality of molded parts 4*a* and 4*b* are supported from below (the −z direction), the shear stress necessary to cut the runner part 12*a* can be easily applied.

Modifications of Embodiment 1

Although the description is given on the assumption that a vertical width of the runner 24*a* on the one end side differs from a vertical width of the runner 24*a* on the other end side, an upper end (an end in the z direction) of the runner 24*a* on the one end side should be formed higher than an upper end (an end in the z direction) of the runner 24*a* on the other end side. Another structure is also applicable. Modifications of Embodiment 1 will be hereinafter described.

Figure 6A:
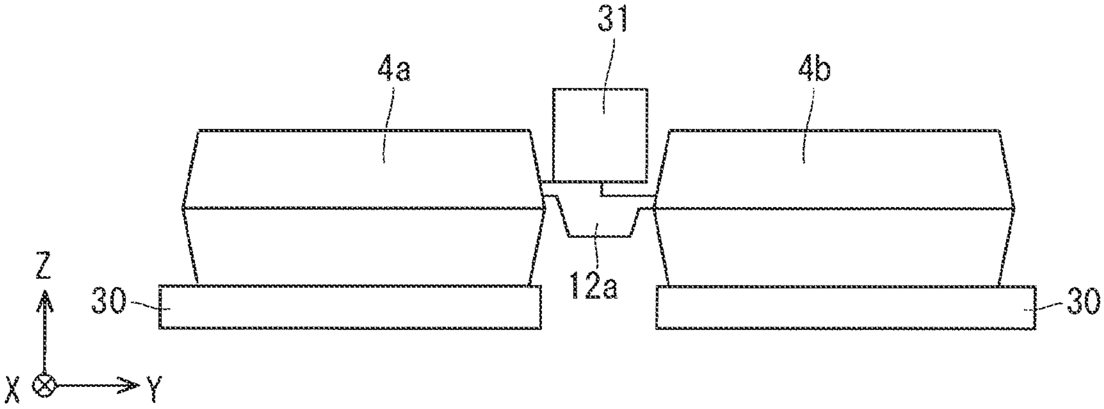
FIGS. 6A to 6C illustrates side views of the resin cutting step according to Modification 1 of Embodiment 1.
Figure 6B:
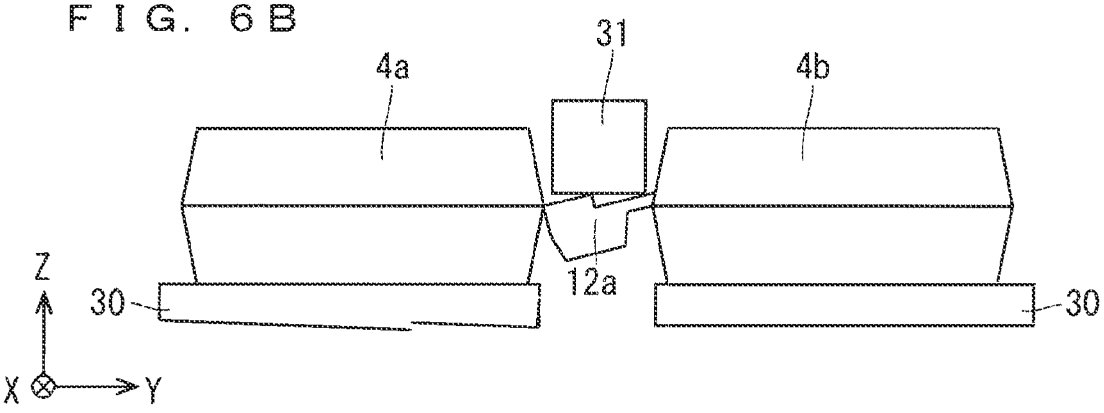
Figure 6C:
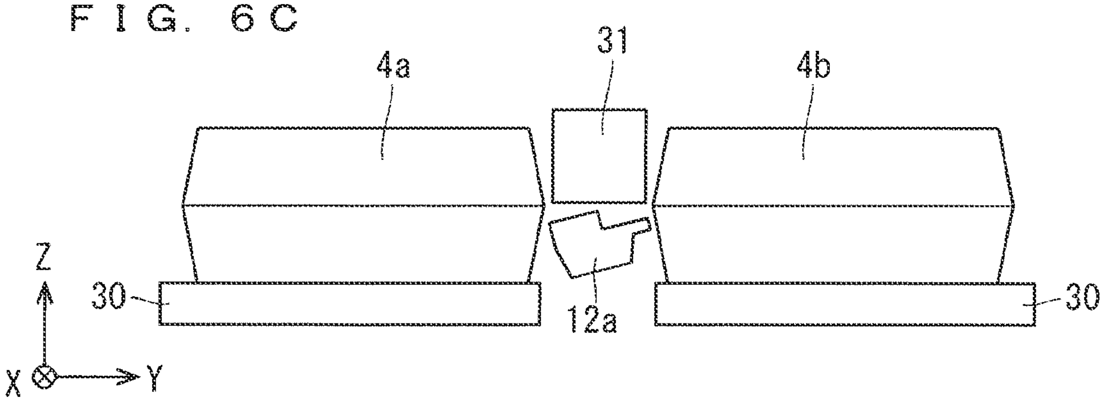
Figure 7:
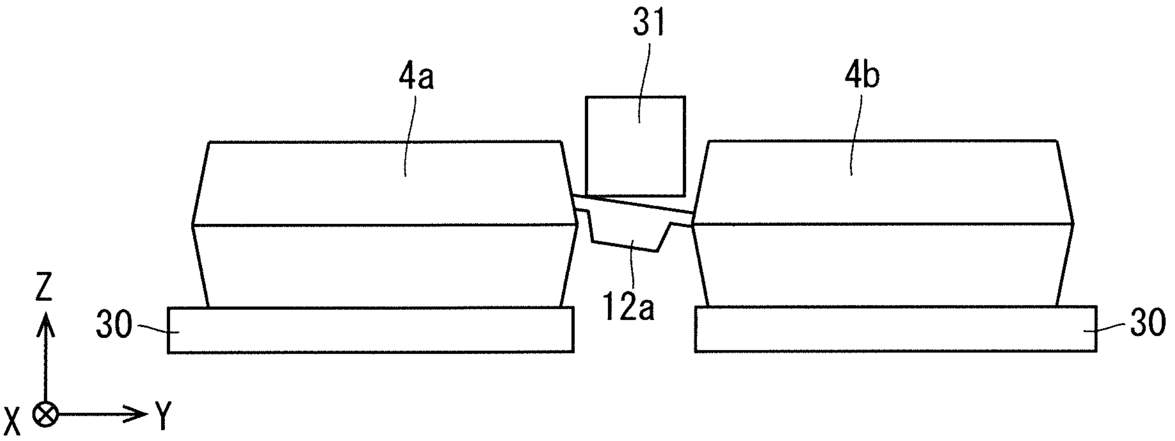
FIG. 7 illustrates a side view of the resin cutting step according to Modification 2 of Embodiment 1.
Figure 8:
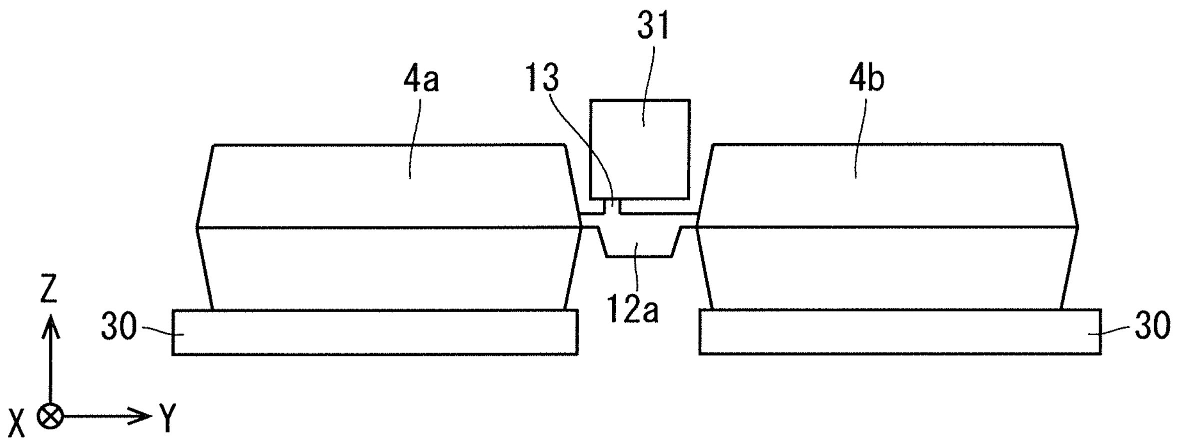
FIG. 8 illustrates a side view of the resin cutting step according to Modification 3 of Embodiment 1.
Figure 9:
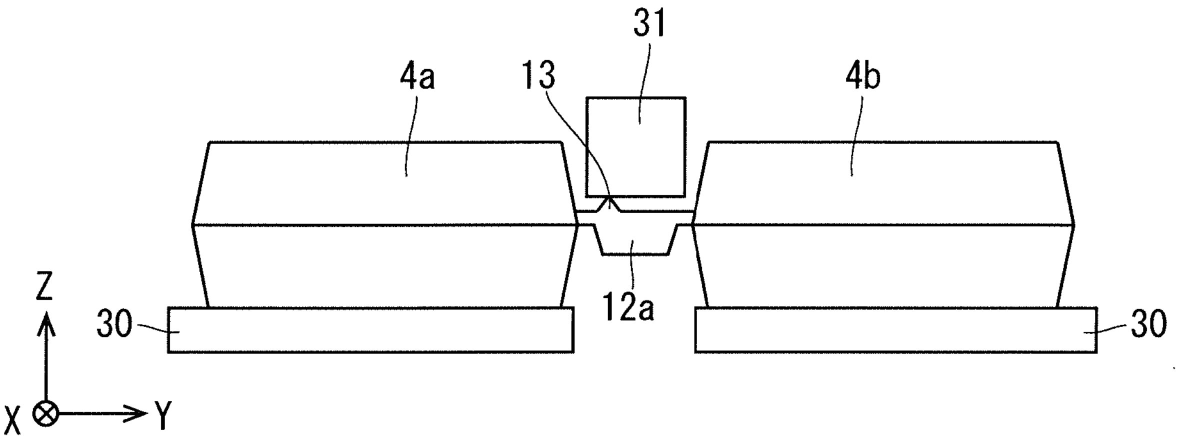
FIG. 9 illustrates a side view of the resin cutting step according to Modification 4 of Embodiment 1.

FIGS. 6A to 6C are side views illustrating the resin cutting step according to Modification 1 of Embodiment 1. FIG. 7 is a side view illustrating the resin cutting step according to Modification 2 of Embodiment 1. FIG. 8 is a side view illustrating the resin cutting step according to Modification 3 of Embodiment 1. FIG. 9 is a side view illustrating the resin cutting step according to Modification 4 of Embodiment 1.

The runner 24*a* may include a step so that the runner 24*a* on the one end side is higher than that on the other end side, which is not illustrated. The step is set so that the runner 24*a* on the one end side is higher than that on the other end side by 0.01 mm or more. Here, a vertical width of the runner 24*a* on the one end side is identical to that on the other end side. Furthermore, setting the step as long as the vertical width of the runner 24*a* on the one end side is more effective. After completion of the molding step, a step is formed so that the runner part 12*a* on the one end side is higher than that on the other end side as illustrated in FIG. 6A.

The resin cutting step illustrated in FIGS. 6A to 6C is performed in the same procedure as illustrated in FIGS. 5A to 5C. This can reduce cracks in the cut portions of the molded parts 4*a* and 4*b* when the runner part 12*a* that connects the adjacent molded parts 4*a* and 4*b* is cut and removed.

The runner 24*a* may include a slope so that a vertical width of the runner 24*a* on the one end side is identical to that on the other end side and the runner 24*a* on the one end side is higher than that on the other end side, which is not illustrated. The slope is set so that the runner 24*a* on the one end side is higher than that on the other end side by 0.01 mm or more. After completion of the molding step, a slope is formed so that the runner part 12*a* on the one end side is higher than that on the other end side as illustrated in FIG. 6A. This produces advantages identical to those according to Modification 1 of Embodiment 1.

The runner 24*a* may include a recess protruding upward (in the z direction) on the one end side that is identical in vertical width to the runner 24*a* on the other end side, which is not illustrated. After completion of the molding step, a protrusion 13 is formed on one end side of the runner part 12*a* so that the runner part 12*a* on the one end side is higher than that on the other end side as illustrated in FIG. 8. The recess formed on the runner 24*a* is cylindrical or columnar. The protrusion 13 on the runner part 12*a* is formed into a cylinder or a prism to fit the recess.

Since the load of the punch 31 concentrates on the protrusion 13 formed on the runner part 12*a*, a starting point at which the runner part 12*a* is cut easily appears. This can reduce cracks in the cut portions of the molded parts 4*a* and 4*b* more than those according to Embodiment 1 and Modifications 1 and 2 thereof.

The recess formed on the runner 24*a* may be acute-angled, which is not illustrated. After completion of the molding step, the protrusion 13 is formed into an acute angle to fit the recess as illustrated in FIG. 9. Specifically, the recess formed on the runner 24*a* is conical or of a triangular pyramid. The protrusion 13 on the runner part 12*a* is formed into a cone or a triangular pyramid to fit the recess.

This can produce the mold 20 at lower cost than that according to Modification 3 of Embodiment 1. This can also reduce cracking of the protrusion 13 when being punched.

Embodiment 2

Figure 10A:
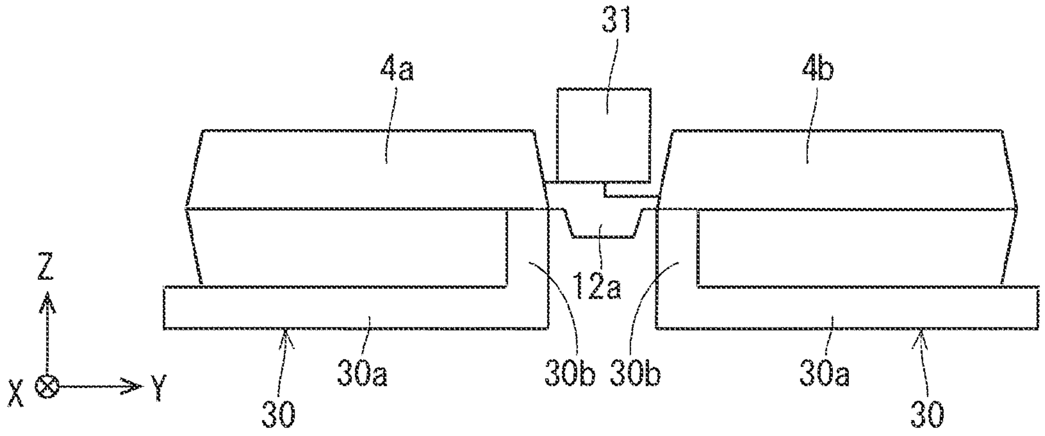
FIGS. 10A and 10B illustrates side views of the resin cutting step according to Embodiment 2.
Figure 10B:
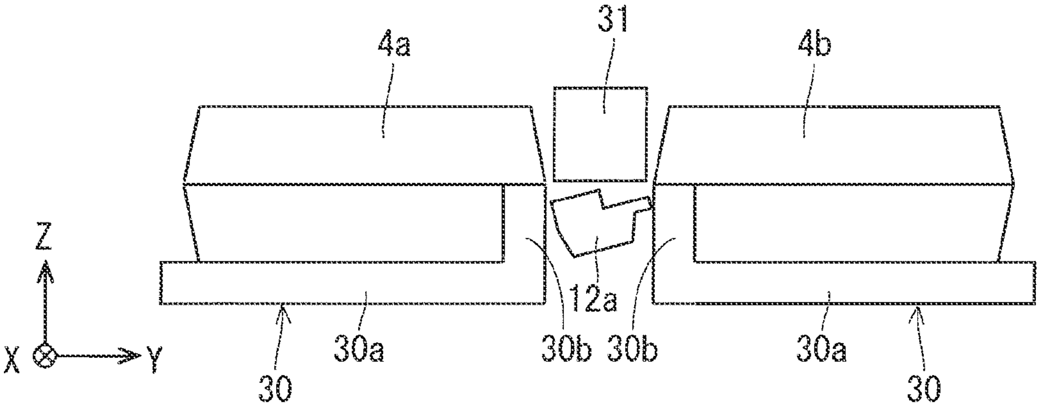

Next, a semiconductor manufacturing apparatus according to Embodiment 2 will be described. FIGS. 10A and 10B are side views illustrating the resin cutting step according to Embodiment 2. In Embodiment 2, the same reference numerals are applied to the same constituent elements described in Embodiment 1, and the description thereof is omitted.

As illustrated in FIGS. 10A and 10B, shapes of the dies 30 according to Embodiment 2 differ from those according to Embodiment 1.

The dies 30 support the molded parts 4*a* and 4*b* from below (the −z direction). In addition, the dies 30 include plates 30*a*, and two vertical portions 30*b* each extending from the upper surface of the plate 30*a* (a surface in the z direction) in a vertical direction (the z-axis direction) so that the plates 30*a* and the vertical portions 30*b* can support peripheries of connections between the runner part 12*a* and the molded parts 4*a* and 4*b* from the side (the x-axis direction).

This supports not only the plurality of molded parts 4*a* and 4*b* from below (the −z direction) but also lower portions of the connections between the runner part 12*a* and the molded parts 4*a* and 4*b* from the side (the x-axis direction). Thus, the shear stress necessary to cut the runner part 12*a* can be more easily applied than that according to Embodiment 1.

Although this disclosure is described in detail, the description is in all aspects illustrative and does not restrict the disclosure. Therefore, numerous modifications and variations that have not yet been exemplified will be devised.

Embodiments can be freely combined, and appropriately modified or omitted.

EXPLANATION OF REFERENCE SIGNS

4, 4*a*, 4*b* molded part, 12*a* runner part, 23*a*, 23*b* cavity, 24*a* runner, 25, 25*a*, 25*b* gate, 30 die, 31 punch.

The invention claimed is:

1. A semiconductor manufacturing apparatus that manufactures a semiconductor device, comprising:

a plurality of cavities filled with a molding resin to form a plurality of respective molded parts; and at least one runner through which the molding resin flows, the at least one runner having one end connected to a gate of one of the cavities, and an other end connected to a gate of an other of the cavities, the cavities being adjacent to each other, wherein an uppermost end of the at least one runner on one end side is higher than an uppermost end of the at least one runner on an other end side, and no lead frame included in the semiconductor device is disposed at each of the gates of the cavities.

2. The semiconductor manufacturing apparatus according to claim 1, wherein a vertical width of the at least one runner on the one end side differs from a vertical width of the at least one runner on the other end side.

3. The semiconductor manufacturing apparatus according to claim 2, further comprising dies supporting the plurality of molded parts from below when at least one runner part connecting the molded parts is cut, the molded parts being adjacent to each other.

4. The semiconductor manufacturing apparatus according to claim 1, wherein the at least one runner includes a step between the one end side and the other end side.

5. The semiconductor manufacturing apparatus according to claim 4, further comprising dies supporting the plurality of molded parts from below when at least one runner part connecting the molded parts is cut, the molded parts being adjacent to each other.

6. The semiconductor manufacturing apparatus according to claim 1, wherein the at least one runner includes a slope between the one end side and the other end side.

7. The semiconductor manufacturing apparatus according to claim 6, further comprising dies supporting the plurality of molded parts from below when at least one runner part connecting the molded parts is cut, the molded parts being adjacent to each other.

8. The semiconductor manufacturing apparatus according to claim 1, wherein the at least one runner includes a recess protruding upward on the one end side.

9. The semiconductor manufacturing apparatus according to claim 8, wherein the recess is acute-angled.

10. The semiconductor manufacturing apparatus according to claim 9, further comprising dies supporting the plurality of molded parts from below when at least one runner part connecting the molded parts is cut, the molded parts being adjacent to each other.

11. The semiconductor manufacturing apparatus according to claim 8, further comprising dies supporting the plurality of molded parts from below when at least one runner part connecting the molded parts is cut, the molded parts being adjacent to each other.

12. The semiconductor manufacturing apparatus according to claim 1, further comprising dies supporting the plurality of molded parts from below when at least one runner part connecting the molded parts is cut, the molded parts being adjacent to each other.

13. A method of manufacturing a semiconductor device, the method comprising the steps of:

(a) preparing a molded product including a plurality of molded parts and at least one runner part connecting the molded parts, the molded parts being adjacent to each other;

(b) applying a load of a punch with one end side of the at least one runner part being in contact with the punch, the one end side being connected to one of the adjacent molded parts; and (c) cutting off the at least one runner part with application of a load of the punch with an other end side of the at least one runner part being in contact with the punch, the other end side being connected to an other of the adjacent molded parts, wherein no lead frame included in the semiconductor device is disposed in the at least one runner part.

14. The method of manufacturing a semiconductor device according to claim 13, wherein in (b), the one end side of the at least one runner part is in direct contact with the punch.

15. A semiconductor manufacturing apparatus that manufactures a semiconductor device, comprising:

a plurality of cavities filled with a molding resin to form a plurality of respective molded parts; and at least one runner through which the molding resin flows, the at least one runner having one end connected to a gate of one of the cavities, and an other end connected to a gate of an other of the cavities, the cavities being adjacent to each other, and the gate of one of the cavities and the gate of the other of the cavities facing each other in a direction along a direction of extension of the at least one runner between the cavities, wherein an upper end of the at least one runner on one end side is higher than an upper end of the at least one runner on an other end side, and no lead frame included in the semiconductor device is disposed at each of the gates of the cavities.

* * * * *